United States Patent
Freeborn et al.

(10) Patent No.: US 9,111,733 B2
(45) Date of Patent: Aug. 18, 2015

(54) PLASMA IGNITION PERFORMANCE FOR LOW PRESSURE PHYSICAL VAPOR DEPOSITION (PVD) PROCESSES

(75) Inventors: Martin Freeborn, Santa Cruz, CA (US); Vince Burkhart, Cupertino, CA (US)

(73) Assignee: Novellus Systems Inc., San Jose, CA (US)

( * ) Notice: Subject to any disclaimer, the term of this patent is extended or adjusted under 35 U.S.C. 154(b) by 1501 days.

(21) Appl. No.: 12/550,573

(22) Filed: Aug. 31, 2009

(65) Prior Publication Data
US 2011/0048924 A1    Mar. 3, 2011

(51) Int. Cl.
| | |
|---|---|
| C23C 14/00 | (2006.01) |
| C25B 11/00 | (2006.01) |
| C25B 13/00 | (2006.01) |
| H01J 37/34 | (2006.01) |
| C23C 14/34 | (2006.01) |

(52) U.S. Cl.
CPC ................. *H01J 37/34* (2013.01); *C23C 14/34* (2013.01); *H01J 37/3444* (2013.01)

(58) Field of Classification Search
CPC .............................. H01J 37/34; H01J 37/3444
See application file for complete search history.

(56) References Cited

U.S. PATENT DOCUMENTS

| | | | |
|---|---|---|---|
| 5,639,519 A | 6/1997 | Patrick et al. | |
| 6,447,655 B2* | 9/2002 | Lantsman | 204/298.08 |
| 6,642,146 B1* | 11/2003 | Rozbicki et al. | 438/687 |
| 2002/0144901 A1* | 10/2002 | Nulman et al. | 204/298.06 |
| 2005/0006222 A1* | 1/2005 | Ding et al. | 204/192.1 |
| 2008/0038925 A1 | 2/2008 | Hudson et al. | |

FOREIGN PATENT DOCUMENTS

| | | |
|---|---|---|
| JP | 10-022265 | 1/1998 |
| JP | 10-340794 | 12/1998 |

OTHER PUBLICATIONS

International Search Report and Written Opinion dated Apr. 1, 2011, in corresponding PCT Application No. PCT/US2010/046310, 9 pages.

* cited by examiner

*Primary Examiner* — Keith Hendricks
*Assistant Examiner* — Ibrahime A Abraham

(57) ABSTRACT

A plasma ignition system includes a first voltage supply that selectively supplies a plasma ignition voltage and a plasma maintenance voltage across an adapter ring and a cathode target of a physical vapor deposition (PVD) system. A second voltage supply selectively supplies a second voltage across the adapter ring and an anode ring of the PVD system. A plasma ignition control module ignites plasma using the plasma ignition voltage and the auxiliary plasma ignition voltage and, after the plasma ignites, supplies the plasma maintenance voltage and ceases supplying the plasma ignition voltage and the auxiliary plasma ignition voltage.

20 Claims, 4 Drawing Sheets

PLASMA IGNITION PERFORMANCE FOR LOW PRESSURE PHYSICAL VAPOR DEPOSITION (PVD) PROCESSES

FIELD

The present disclosure relates to physical vapor deposition (PVD), and more particularly to plasma ignition systems and methods for PVD.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring now to FIG. 1, an exemplary physical vapor deposition (PVD) system 10 is shown. For discussion purposes only, a hollow cathode magnetron (HCM) sputtering system is shown. The PVD system 10 includes a cathode 16 with a cathode target housing 18 and a cathode target 20. An anode 24 includes an anode ring 28, which is arranged adjacent to the cathode target 20. An adapter 34 is arranged adjacent to the anode 24 and includes an adapter ring 38. A pedestal 42 is arranged in a chamber 40. Both direct current (DC) and/or radio frequency (RF) biases may be applied to the pedestal 42. Electrostatic charge (ESC) may be used to releasably attach a substrate 44 such as a wafer to a cathode-facing surface of the pedestal 42.

In use, an inert gas is supplied in the chamber 40 near the cathode target 20. For example only, the inert gas may include Argon gas. A high voltage and vacuum is typically applied to the inert gas to ionize the gas, which creates plasma (hereinafter plasma ignition). Magnets and/or electromagnets 50, 52, 54, and/or 56 may be provided to shape and concentrate the plasma as will be described below. The magnets and/or electromagnets 50 may be rotatable.

A voltage supply V supplies a negative DC voltage across the cathode target 20 and the adapter ring 38. The adapter ring 38 and the chamber 40 may be connected to chassis ground or another reference potential. The anode ring 28 is allowed to float. In other words, the anode ring 28 is neither grounded nor biased.

In the example shown in FIG. 1, the cathode target 20 may have a cup-like shape to help concentrate the plasma. The cathode target 20 supplies metal material for sputtering. For example only, the cathode target 20 may be made of aluminum, tantalum, or other suitable metal that is to be deposited onto the substrate 44.

Magnetic fields may be produced by the magnets and/or electromagnets 50, 52, and/or 54. Additional magnets or electromagnets 56 may be arranged downstream of the cathode target 20 near the anode 24. The magnets or electromagnets produce a variable ion flux that may be used to control deposition, etch rate and/or uniformity.

For example, the magnets and/or electromagnets near the cathode target 20 trap free electrons in a magnetic field near a surface of the cathode target 20. The trapped electrons are not free to bombard the cathode target 20 to the same extent as with diode sputtering. A path travelled by these electrons when trapped in the magnetic field enhances their probability of ionizing a neutral gas molecule by several orders of magnitude. The increase in available ions significantly increases the rate at which target material is eroded and subsequently deposited onto the substrate 44.

The anode 24 and anode ring 28, which are typically held at plasma floating potential, may also be used in conjunction with the magnets and/or electromagnets to shape the plasma distribution. Ion energy and an etch rate can be controlled by applying an RF bias to the pedestal 42. An additional function of the pedestal 42 may include wafer temperature control during deposition and sputtering.

For some processes, relatively low chamber pressures and flow rates may be used. For example, some processes may use 2 standard cubic centimeters per minute (SCCM) flow Argon gas and chamber pressures of approximately $2 \times 10^{-4}$ torr. When running at these low pressures and flow rates, it may be difficult to ignite the plasma, which may cause a time-out error during startup.

As a result, these low pressure processes tend to require significantly higher bias voltages to ignite the plasma as compared to higher pressure processes. Normally, the plasma may be ignited between the adaptor ring 38 and the cathode target 20, which may involve a relatively large gap.

SUMMARY

A plasma ignition system comprises a first voltage supply that selectively supplies a plasma ignition voltage and a plasma maintenance voltage across an adapter ring and a cathode target of a physical vapor deposition (PVD) system. A second voltage supply selectively supplies a second voltage across the adapter ring and an anode ring of the PVD system. A plasma ignition control module ignites plasma using the plasma ignition voltage and the auxiliary plasma ignition voltage and, after the plasma ignites, supplies the plasma maintenance voltage and ceases supplying the plasma ignition voltage and the auxiliary plasma ignition voltage.

In other features, the first voltage supply comprises a plasma ignition voltage supply that supplies the plasma ignition voltage before the plasma ignites and a plasma maintenance voltage supply that supplies the plasma maintenance voltage after the plasma ignites.

In other features, the plasma ignition control module compares at least one of voltage and current supplied by the first voltage supply to at least one of a voltage threshold and a current threshold, respectively, and selectively supplies the auxiliary plasma ignition voltage using the second voltage supply based on the comparison.

In other features, the cathode target selectively communicates with a negative terminal of the first voltage supply and the adapter ring selectively communicates with a positive terminal of the first voltage supply. The adapter ring selectively communicates with a negative terminal of the second voltage supply and the anode ring communicates with a positive terminal of the second voltage supply. The plasma ignition control module supplies the auxiliary plasma ignition voltage from the second voltage supply when the measured voltage is greater than the voltage threshold and the measured current is less than the current threshold. The plasma ignition control module ceases supplying the auxiliary plasma ignition voltage when the measured current is greater than the current threshold.

A plasma ignition system comprises a voltage comparing module that compares a first voltage supplied across a cathode target and an adapter ring of a physical vapor deposition (PVD) system to a voltage threshold. A current comparing module compares current supplied to the cathode target to a current threshold. A voltage control module selectively supplies a second voltage across the adapter ring of the PVD system and an anode ring based on the comparison.

In other features, the voltage control module supplies the second voltage when the measured voltage is greater than a voltage threshold and the measured current is less than a current threshold. The voltage control module ceases supplying the second voltage when the measured current is greater than the current threshold.

A physical vapor deposition (PVD) system comprises the plasma ignition system and further comprises a first voltage supply that communicates with the voltage control module and that supplies the first voltage. The cathode target selectively communicates with a negative terminal of the first voltage supply and the adapter ring selectively communicates with a positive terminal of the first voltage supply. A second voltage supply communicates with the voltage control module and supplies the second voltage. The adapter ring selectively communicates with a negative terminal of the second voltage supply and the anode ring communicates with a positive terminal of the second voltage supply.

In other features, the PVD system further comprises a cathode comprising the cathode target, an anode comprising the anode ring, an adapter comprising the adapter ring, a chamber, and a pedestal arranged in the chamber that supports a substrate.

A method for igniting plasma in a physical vapor deposition (PVD) system comprises selectively supplying a first voltage across an adapter ring and a cathode target of a physical vapor deposition (PVD) system; selectively supplying a second voltage across the adapter ring and an anode ring of the PVD system; igniting plasma using the first and second voltages; and ceasing supplying the second voltage after the plasma ignites.

In other features, the method includes supplying the second voltage when the measured voltage is greater than a voltage threshold and the measured current is less than a current threshold. The method includes ceasing supplying the second voltage when the measured current is greater than the current threshold.

In other features, the method includes connecting a negative terminal of a first voltage supply that supplies the first voltage with the cathode target; and connecting a positive terminal of the first voltage supply to the adapter ring.

In other features, the method includes connecting a negative terminal of the second voltage supply with the adapter ring; and connecting a positive terminal of the second voltage supply with the anode ring.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
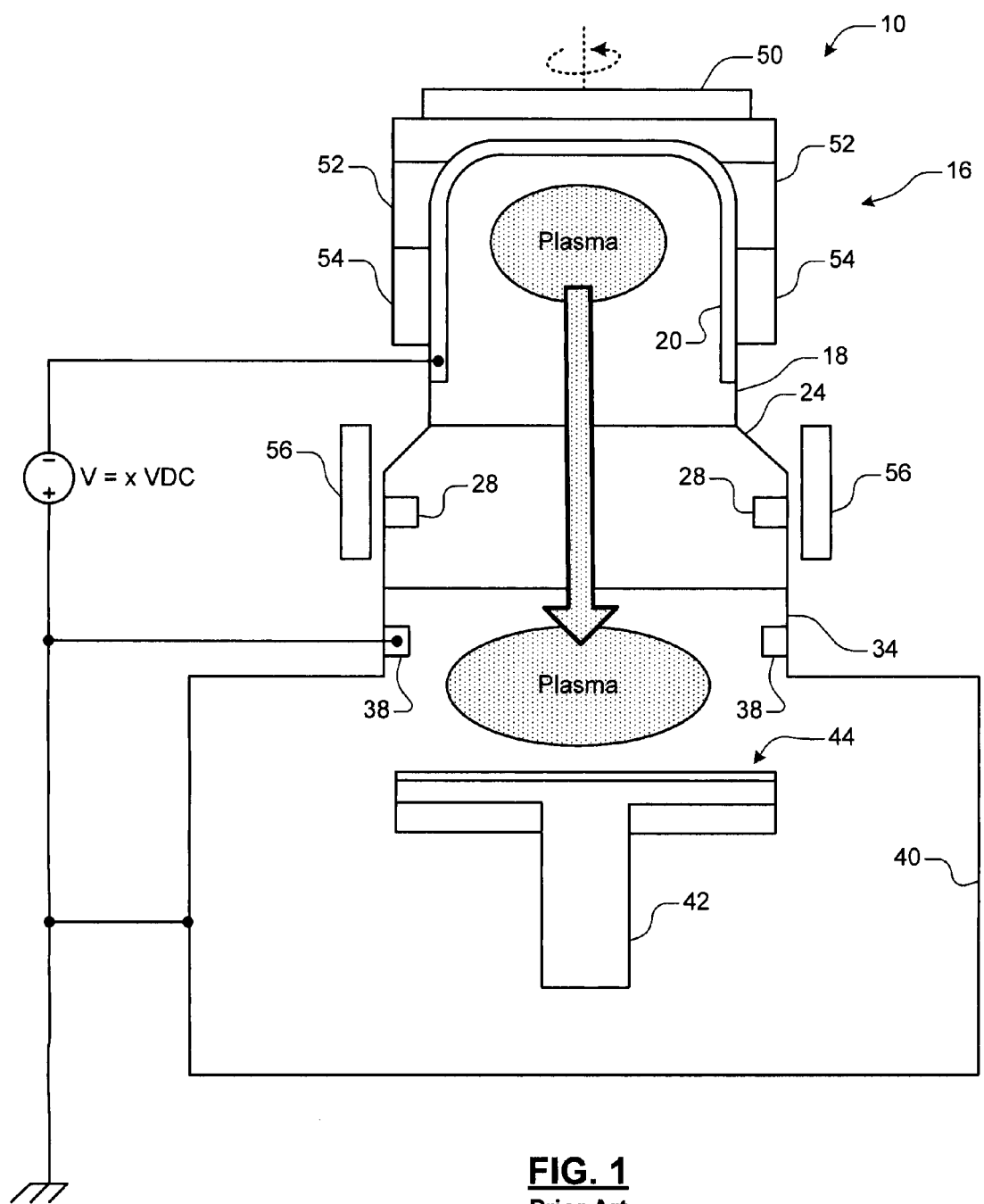
FIG. 1 is a cross-sectional view of a physical vapor deposition (PVD) system according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Systems and methods described in the present disclosure improve plasma ignition reliability and speed in physical vapor deposition (PVD) systems and methods. While the preceding and foregoing description provides details relating to magnetron and hollow cathode magnetron (HCM) type PVD systems and methods, the present disclosure has application to other types of PVD systems and methods.

The present disclosure increases strike reliability without increasing wafer contamination levels. While being particularly suited to low flow, low pressure PVD systems and processes, the present disclosure has application in other PVD systems and methods. As used herein, low pressure PVD systems employ chamber pressures less than or equal to $2 \times 10^{-4}$ torr during plasma ignition and sputtering. Low flow PVD systems employ flow rates less than or equal to 2 standard cubic centimeters per minute (SCCM) during plasma ignition and sputtering.

According to the present disclosure, the anode ring is biased by a high voltage, low current power supply during plasma ignition. The anode ring bias is also synchronized with the cathode target bias as will be described further below.

Voltage, pressure and volume all impact the ability to ionize a gas. By applying additional voltage to the anode ring during ignition, the plasma strike reliability is improved. The improved reliability is due to the increased voltage potential over a shorter gap. By applying a high positive voltage to the anode ring, the plasma ignites between the cathode target and the anode ring. The plasma striking voltage is effectively increased while a gap across which the plasma striking voltage needs to jump is decreased. For example only, the gap may be reduced from about 8 inches in one implementation of FIG. 1 to less than approximately 0.5 inches in one implementation of FIG. 2. As a result, the plasma is more likely to ignite under these conditions.

Figure 2:
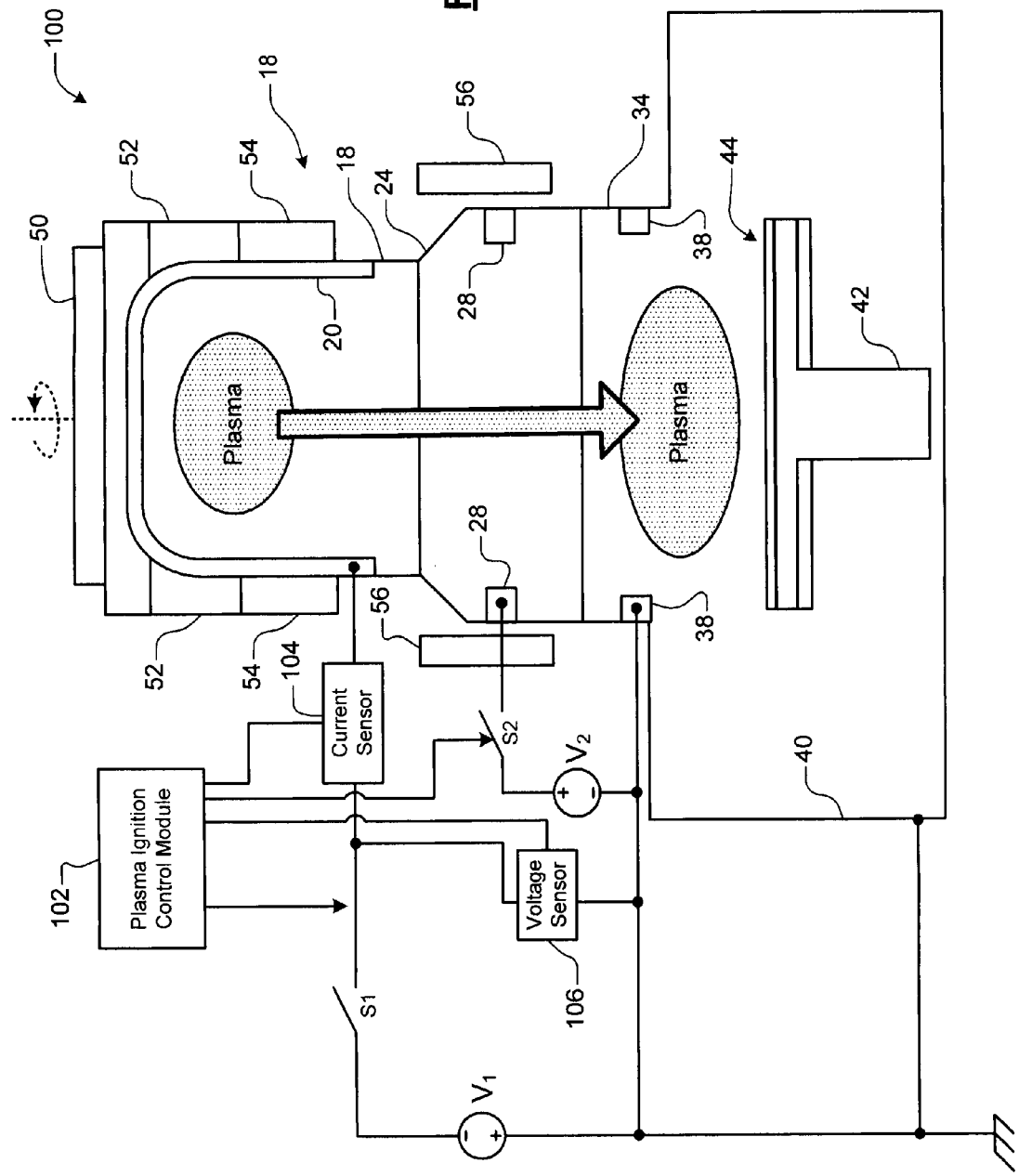
FIG. 2 is a cross-sectional view and functional block diagram of an exemplary PVD system according to the present disclosure.

Referring now to FIG. 2, a PVD system 100 according to the present disclosure is shown. The PVD system and method 100 includes similar elements as those shown in FIG. 1. Therefore, the same reference numbers have been used where appropriate.

The PVD system 100 further includes a plasma ignition control module 102 that controls voltage supplies $V_1$ and $V_2$ as will be described further below to ignite the plasma. More particularly, the plasma ignition control module 102 switches the first voltage supply $V_1$ on to deliver voltage and current from the first voltage supply $V_1$ when the sputtering process has been enabled. For example, the first voltage supply $V_1$ may supply voltage via a switch S1 that is controlled by the plasma ignition control module 102. The first voltage supply $V_1$ supplies a plasma ignition voltage while igniting the plasma and a plasma maintenance voltage after the plasma ignites.

The switch S1 connects the voltage supply across the cathode target 20 and the adapter ring 38. The negative terminal of the first voltage supply $V_1$ may be connected to the cathode target 20 while the positive terminal may be connected to the adapter ring 38. The adapter ring 38 is also connected to chassis ground or another reference potential.

More particularly, the plasma ignition control module 102 switches the second voltage supply $V_2$ to deliver voltage and current from the second voltage supply $V_2$ when the sputtering process has been enabled and certain other conditions are met. For example, the second voltage supply $V_2$ may supply voltage via a second switch S2 that is controlled by the plasma ignition control module 102. The second switch S2 connects the voltage supply $V_2$ across the anode ring 28 and the adapter ring 38. The positive terminal of the second voltage supply $V_2$ may be connected to the anode ring 28 while the negative terminal may be connected to the adapter ring 38.

The plasma ignition control module 102 may further communicate with a current sensor 104, which monitors current supplied by the first voltage $V_1$. The plasma ignition control module 102 may further communicate with a voltage sensor 106, which monitors voltage across the cathode target 20 and the adapter ring 38. The plasma ignition control module 102 compares at least one of the measured current and voltage to at least one of a current threshold and a voltage threshold, respectively, and selectively opens and closes the switch S2 based on the comparison.

Without changing the pressures and flow rates in the plasma chamber, the second voltage supply $V_2$ has been added to supply voltage to the anode ring 28. During plasma ignition with the anode ring 28 biased, the plasma ignites between the cathode target 20 and the anode ring 28. This eliminates the gap normally provided by the anode ring 28.

Biasing the anode ring 28 all of the time may tend to promote wafer contamination. However, this tendency is mitigated according to the present disclosure by synchronizing the biasing of the anode ring 28 with biasing of the cathode target 20. If the high voltage continually biases the anode ring 28, parasitic plasma may tend to ignite between the anode ring 28 and the adapter ring 38 (which is at ground) when the chamber 40 reaches a particular pressure. The parasitic plasma could potentially sputter metal from the anode ring 28 and adapter ring 38 (or shields) onto the substrate 44.

Thus, the plasma ignition control module 102 monitors the cathode target voltage. When the plasma is attempting to ignite, the plasma ignition control module 102 controls the second voltage supply to the anode ring 28. Synchronizing the voltage bias to the anode ring 28 with the voltage bias to the cathode target 20 also forces the plasma to ignite between the cathode target and the anode ring instead of between the anode ring 28 and the adapter ring 38. This is due to the larger voltage differential (2900V+) between the cathode target 20 and anode ring 28 versus between the anode ring 28 and the adapter ring 38 (1500V+) with approximately the same gas pressure and gap.

Figure 3:
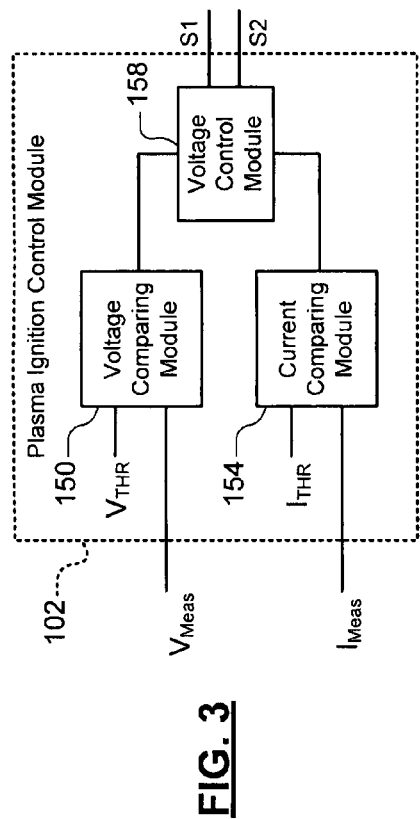
FIG. 3 is a functional block diagram illustrating an exemplary plasma ignition control module.

Referring now to FIG. 3, an exemplary implementation of the plasma ignition control module 102 of FIG. 2 is shown in further detail. The plasma ignition control module 102 includes a voltage comparing module 150. The voltage comparing module 150 compares a measured voltage $V_{Meas}$ from the voltage sensor 106 to the voltage threshold $V_{THR}$ and generates a voltage comparison signal.

The plasma ignition control module 102 also includes a current comparing module 154. The current comparing module 154 compares a measured current $I_{Meas}$ from the current sensor 104 to the current threshold $I_{THR}$ and generates a current comparison signal. A voltage control module 158 receives the voltage and current comparison signals and selectively controls the switches S1 and S2 based thereon as will be discussed below.

Figure 4:
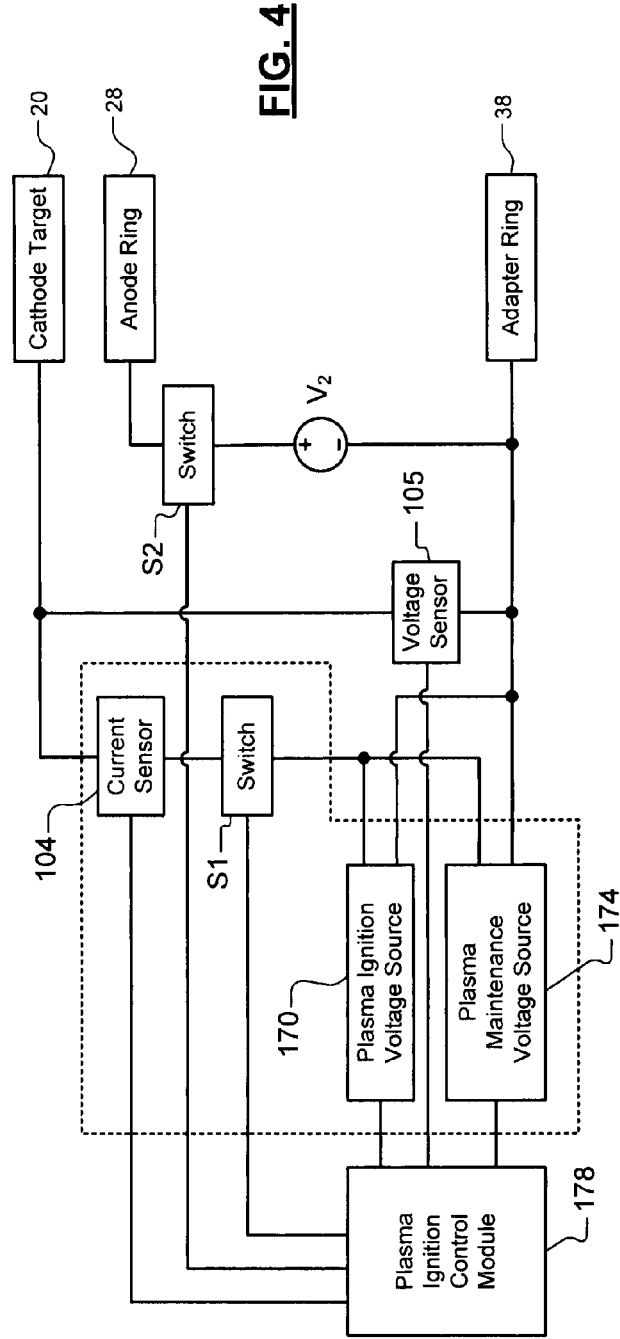
FIG. 4 is a functional block diagram of an alternate plasma ignition control system.

Referring now to FIG. 4, an alternate exemplary implementation is shown. The voltage source $V_1$ may include a plasma ignition voltage source 170 and a plasma maintenance voltage source 174. In some implementations, the switch S1 and the current sensor 104 may also be part of the voltage source $V_1$. The plasma ignition voltage source 170 provides high voltage and low current during ignition. After plasma ignition occurs, the plasma maintenance voltage source 174 generates lower voltage and higher current.

For example only, the voltage generated by the plasma ignition voltage source 170 may be greater than about 575V DC and the current may be less than 0.75 A. In some implementations, the plasma ignition voltage source 170 may generate about 1400V DC. The plasma maintenance voltage source 174 may generate voltage that is less than about 575V DC depending upon an impedance of the chamber and other factors and current that is greater than 0.75 A.

The plasma ignition control module 178 controls the plasma ignition voltage source 170 to provide the first voltage during plasma ignition and the plasma maintenance voltage source 174 to provide the first voltage after plasma ignition. Otherwise, the plasma ignition control module 178 operates in a manner similar to the plasma ignition control module 102 in FIGS. 2 and 3.

Figure 5:
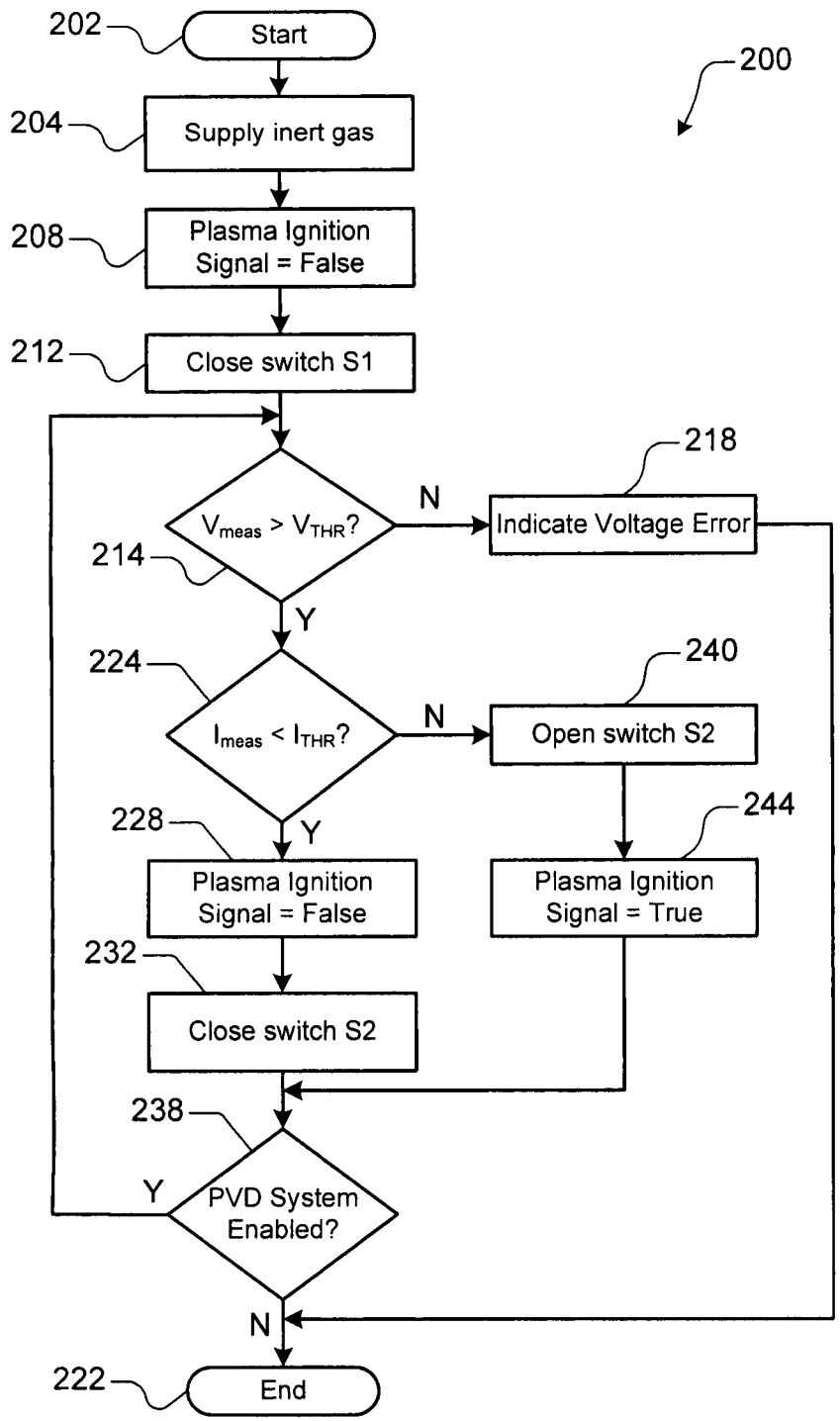
FIG. 5 illustrates steps of a method for igniting plasma in the PVD system according to the present disclosure.

Referring now to FIG. 5, a method 200 for igniting plasma in a physical vapor deposition system is shown. Control begins in step 202. In step 204, an inert gas is supplied in the chamber. In step 208, a plasma ignition signal is set to false.

In step 212, the switch S1 is closed to supply voltage $V_1$ across the cathode target 20 and the adapter ring 38. In step 214, the measured voltage $V_{MEAS}$ is compared to the voltage threshold $V_{THR}$. If the measured voltage $V_{MEAS}$ is less than the voltage threshold $V_{THR}$ in step 214, then a low voltage indicator signal is generated in step 218 and control ends in step 222 (or returns to step 214).

If the measured voltage $V_{MEAS}$ is greater than the voltage threshold $V_{THR}$ in step 214, the measured current $I_{Meas}$ is compared to the current threshold $I_{THR}$ in step 224. If the measured current $I_{Meas}$ is less than the current threshold $I_{THR}$ in step 224, the correct voltage and current is present across the cathode target 20 and adapter ring 38 and the plasma can be ignited. The plasma ignition signal is set to false in step 228 and the switch S2 is closed in step 232. By closing the switch S2, the anode ring 28 is biased with voltage $V_2$ as described above.

In step 238, control determines whether the PVD system remains enabled. In other words, if an operator is turning the PVD system off, then there is no reason to ignite the plasma. If step 238 is true, control returns to step 214. If the PVD system is no longer on, control continues with step 222 where control ends.

If the measured current $I_{Meas}$ is greater than the current threshold $I_{THR}$ in step 224, the plasma has been ignited and the switch S2 is opened at 240. This removes the bias from the anode ring 28, since the plasma has ignited. In step 244, the plasma ignition signal is set to true and control continues with step 238.

The present disclosure may be implemented using an Inova NExT PVD chamber available from Novellus Systems Inc., although other types of PVD systems may be used. The low pressure process windows for 32 nm is approximately 2 SCCM flow Argon gas and a chamber pressure of approximately $2\times10^{-4}$ torr. The current threshold can be set to 0.75 Amps of current and the voltage threshold may be set to 575V DC, although other thresholds may be used. The first voltage supply may provide 1400V DC while the second voltage supply may provide 1500V DC.

Experimental data results show significant improvement in plasma ignition times. Over a significant number of samples, a maximum plasma ignition time was improved from over 7 seconds to 1 second and average ignition times were improved from 1.5 seconds to approximately 0.2 seconds.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A plasma ignition system comprising:
   a first voltage supply that selectively supplies a plasma ignition voltage and a plasma maintenance voltage across an adapter ring and a cathode target of a physical vapor deposition (PVD) system;
   a second voltage supply that selectively supplies an auxiliary plasma ignition voltage across the adapter ring and an anode ring of the PVD system; and
   a plasma ignition control module that ignites plasma using the plasma ignition voltage and the auxiliary plasma ignition voltage and, after the plasma ignites, supplies the plasma maintenance voltage and ceases supplying the plasma ignition voltage and the auxiliary plasma ignition voltage.

2. The plasma ignition system of claim 1 wherein the first voltage supply comprises:
   a plasma ignition voltage supply that supplies the plasma ignition voltage before the plasma ignites; and
   a plasma maintenance voltage supply that supplies the plasma maintenance voltage after the plasma ignites.

3. The plasma ignition system of claim 1 wherein the plasma ignition control module compares at least one of voltage and current supplied by the first voltage supply to at least one of a voltage threshold and a current threshold, respectively, and that selectively supplies the auxiliary plasma ignition voltage using the second voltage supply based on the comparison.

4. The plasma ignition system of claim 1 wherein the cathode target selectively communicates with a negative terminal of the first voltage supply and the adapter ring selectively communicates with a positive terminal of the first voltage supply.

5. The plasma ignition system of claim 1 wherein the adapter ring selectively communicates with a negative terminal of the second voltage supply and the anode ring communicates with a positive terminal of the second voltage supply.

6. The plasma ignition system of claim 3 wherein the plasma ignition control module supplies the auxiliary plasma ignition voltage from the second voltage supply when the voltage is greater than the voltage threshold and the current is less than the current threshold.

7. The plasma ignition system of claim 6 wherein the plasma ignition control module ceases supplying the auxiliary plasma ignition voltage when the current is greater than the current threshold.

8. A PVD system comprising the plasma ignition system of claim 1 and further comprising:
   a cathode comprising the cathode target;
   an anode comprising the anode ring;
   an adapter comprising the adapter ring;
   a chamber; and
   a pedestal arranged in the chamber that supports a substrate.

9. The PVD system of claim 1 wherein the cathode target is cup-shaped.

10. The PVD system of claim 8 wherein a pressure of the chamber is less than or equal to $2\times10^{-4}$ torr during plasma ignition and wherein a flow rate of inert gas is less than or equal 2 standard cubic centimeters per minute during plasma ignition.

11. A plasma ignition system, comprising:
    a voltage comparing module that compares a first voltage supplied across a cathode target and an adapter ring of a physical vapor deposition (PVD) system to a voltage threshold;
    a current comparing module that compares current supplied to the cathode target to a current threshold; and
    a voltage control module that selectively supplies a second voltage across the adapter ring of the PVD system and an anode ring based on the comparison.

12. The plasma ignition system of claim 11 wherein the voltage control module supplies the second voltage when the voltage is greater than a voltage threshold and the current is less than a current threshold.

13. The plasma ignition system of claim 12 wherein the voltage control module ceases supplying the second voltage when the current is greater than the current threshold.

14. A physical vapor deposition (PVD) system comprising the plasma ignition system of claim 11 and further comprising:
    a first voltage supply that communicates with the voltage control module and that supplies the first voltage,
    wherein the cathode target selectively communicates with a negative terminal of the first voltage supply and the adapter ring selectively communicates with a positive terminal of the first voltage supply.

15. The PVD system of claim 14 further comprising:
    a second voltage supply that communicates with the voltage control module and that supplies the second voltage,
    wherein the adapter ring selectively communicates with a negative terminal of the second voltage supply and the anode ring communicates with a positive terminal of the second voltage supply.

16. The PVD system of claim 15 further comprising:
    a cathode comprising the cathode target;
    an anode comprising the anode ring;
    an adapter comprising the adapter ring;
    a chamber; and
    a pedestal arranged in the chamber that supports a substrate.

17. The PVD system of claim 16 wherein the cathode target is cup-shaped.

18. The PVD system of claim 16 wherein a pressure of the chamber is less than or equal to $2\times10^{-4}$ torr during plasma ignition and wherein a flow rate of inert gas is less than or equal 2 standard cubic centimeters per minute during plasma ignition.

19. The plasma ignition system of claim 1, wherein the plasma maintenance voltage, the plasma ignition voltage and the auxiliary plasma ignition voltage are DC bias voltages.

20. The plasma ignition system of claim 11, wherein the first voltage and the second voltage are DC bias voltages.

* * * * *